(12) United States Patent
Ichikawa et al.

(10) Patent No.: US 9,000,343 B2
(45) Date of Patent: Apr. 7, 2015

(54) SOLID-STATE IMAGING APPARATUS

(75) Inventors: Takeshi Ichikawa, Hachioji (JP); Mineo Shimotsusa, Machida (JP); Genzo Momma, Hiratsuka (JP)

(73) Assignee: Canon Kabushiki Kaisha, Tokyo (JP)

( * ) Notice: Subject to any disclaimer, the term of this patent is extended or adjusted under 35 U.S.C. 154(b) by 282 days.

(21) Appl. No.: 13/807,002

(22) PCT Filed: Jun. 23, 2011

(86) PCT No.: PCT/JP2011/003591
§ 371 (c)(1),
(2), (4) Date: Dec. 26, 2012

(87) PCT Pub. No.: WO2012/001922
PCT Pub. Date: Jan. 5, 2012

(65) Prior Publication Data
US 2013/0092822 A1     Apr. 18, 2013

(30) Foreign Application Priority Data
Jun. 30, 2010   (JP) ................................ 2010-149478

(51) Int. Cl.
*H01L 27/146*     (2006.01)
*H01L 31/00*      (2006.01)

(52) U.S. Cl.
CPC .... *H01L 27/14601* (2013.01); *H01L 27/14603* (2013.01); *H01L 27/14609* (2013.01); *H01L 27/14634* (2013.01); *H01L 27/14636* (2013.01); *H01L 27/1464* (2013.01); *H01L 27/14645* (2013.01); *H01L 27/1469* (2013.01)

(58) Field of Classification Search
CPC ........................ H01L 27/146; H01L 27/14636

USPC ................. 250/208.1; 257/444, 292, 31.063, 257/31.115, 25.032, 27.133
See application file for complete search history.

(56) References Cited

U.S. PATENT DOCUMENTS

| | | | |
|---|---|---|---|
| 7,671,435 B2 * | 3/2010 | Ahn ............................... | 257/444 |
| 8,450,856 B2 * | 5/2013 | Kang et al. ..................... | 257/774 |
| 8,508,012 B2 * | 8/2013 | Ahn ............................... | 257/444 |
| 8,716,712 B2 * | 5/2014 | Kozuma et al. ................. | 257/59 |
| 2007/0069258 A1 | 3/2007 | Ahn | |

FOREIGN PATENT DOCUMENTS

| | | |
|---|---|---|
| JP | 2006-191081 A | 7/2006 |
| JP | 2008-235478 A | 10/2008 |
| WO | 2006/109937 A1 | 10/2006 |
| WO | 2008/117956 A1 | 10/2008 |
| WO | 2008/156274 A1 | 12/2008 |

* cited by examiner

*Primary Examiner* — Tony Ko
(74) *Attorney, Agent, or Firm* — Canon USA, Inc. IP Division

(57) ABSTRACT

The present invention relates to a solid-state imaging apparatus including a first substrate having a plurality of photoelectric conversion units and a second substrate having a plurality of readout circuits. The first substrate is provided with a plurality of first conductive patterns that are electrically separated from one another and the second substrate is provided with a plurality of second conductive patterns that are electrically separated from one another. The first conductive patterns each include a first partial pattern extending in a first direction. The second conductive patterns each include a partial pattern extending in a second direction different from the first direction. The first partial pattern has a length extending in the first direction longer than a length thereof in the second direction.

21 Claims, 7 Drawing Sheets

SOLID-STATE IMAGING APPARATUS

TECHNICAL FIELD

The present invention relates to a solid-state imaging apparatus including a first substrate having a plurality of photoelectric conversion units and a second substrate laminated to the first substrate and having a plurality of readout circuits to process or read signals generated by each of the photoelectric conversion units.

BACKGROUND ART

Solid-state imaging apparatuses are known to have a structure in which photoelectric conversion units are arranged on a substrate and peripheral circuits and part of pixel circuits are arranged on another substrate, and these substrates are electrically connected to each other.

Japanese Patent Application Laid-Open No. 2006-191081 discusses a backside illumination type solid-state image sensor in which photoelectric conversion units on a first substrate are connected to peripheral circuits on a second substrate through bonding pads provided on the front surfaces of the respective substrates in order to improve the sensitivity of the photoelectric conversion units.

Japanese Patent Application Laid-Open No. 2008-235478 discusses an image sensor including a first substrate having photodetection pixels and through wiring and a second substrate having readout circuits. The readout circuit reads an electrical signal via the through wiring and output the signal as an image signal. In this solid-state image sensor, a rear surface of the first substrate faces the readout circuits on the second substrate and the through wiring is electrically connected to the readout circuits at their terminals.

CITATION LIST

Patent Literature

PTL 1: Japanese Patent Application Laid-Open No. 2006-191081
PTL 2: Japanese Patent Application Laid-Open No. 2008-235478

SUMMARY OF INVENTION

Technical Problem

In a structure in which photoelectric conversion units are arranged on a substrate, a part of pixel circuits and peripheral circuits are arranged on another substrate, and these substrates are electrically connected to each other, higher accuracy in alignment is required in accordance with the miniaturization of pixels and elements constituting the circuits. For example, the miniaturization makes it difficult to ensure electrical connections at a large number of electrical connection nodes of every pixel. In addition, as discussed in Japanese Patent Application Laid-Open No. 2008-235478, using a micro-bump structure on connection portions hinders the miniaturization.

The present invention relates to a solid-state imaging apparatus capable of providing reliable electrical connections between miniaturized elements arranged therein.

Solution to Problem

According to an aspect of the present invention, a solid-state imaging apparatus includes a first substrate on which a plurality of photoelectric conversion units is arranged and a second substrate on which a plurality of readout circuits to process or read a signal generated by each of the photoelectric conversion units is arranged. The solid-state imaging apparatus includes a plurality of first conductive patterns which are arranged on the first substrate and electrically separated from one another, and a plurality of second conductive patterns which are arranged on the second substrate and electrically separated from one another, wherein each of the plurality of first conductive patterns has a first electrical connection portion to be in contact with the second conductive patterns, and each of the plurality of second conductive patterns has a second electrical connection portion to be in contact with the first conductive patterns, wherein the first conductive pattern includes a first partial pattern that includes the first electrical connection portion and extends in a first direction, and the second conductive pattern includes a second partial pattern that includes the second electrical connection portion and extends in a second direction different from the first direction, and wherein the first partial pattern has a length extending in the first direction longer than a length thereof in the second direction.

Advantageous Effects of Invention

According to the present invention, in a solid-state imaging apparatus including a plurality of substrates which are separately formed and electrically connected to one another, the electrical connection between the substrates can be provided without fail.

Further features and aspects of the present invention will become apparent from the following detailed description of exemplary embodiments with reference to the attached drawings.

BRIEF DESCRIPTION OF DRAWINGS

The accompanying drawings, which are incorporated in and constitute a part of the specification, illustrate exemplary embodiments, features, and aspects of the invention and, together with the description, serve to explain the principles of the invention.

DESCRIPTION OF EMBODIMENTS

Various exemplary embodiments, features, and aspects of the invention will be described in detail below with reference to the drawings.

Figure 1:
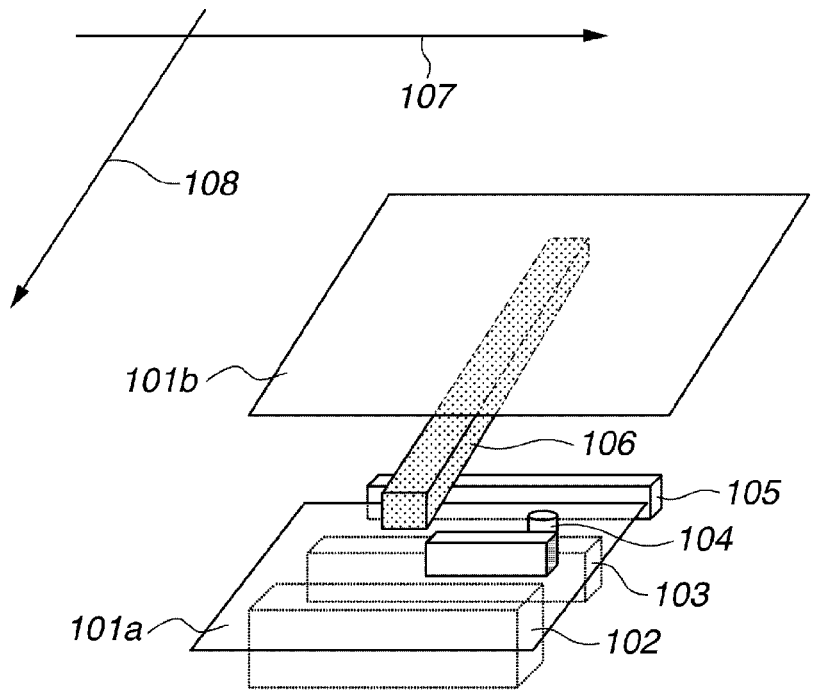
FIG. 1 is a schematic cross sectional view illustrating a solid-state imaging apparatus according to a first exemplary embodiment.

FIG. 1 is a schematic cross sectional view illustrating an electrical connection between first and second substrates of a solid-state imaging apparatus according to a first exemplary embodiment. The substrate according to the first exemplary embodiment includes semiconductor portions based on silicon, but the portions may be based on gallium or arsenic, and the substrates may be silicon-on-insulator (SOI) substrates.

Further, the substrate includes a portion based on semiconductor material, an insulating layer adjoining the portion based on semiconductor material, a wiring layer, and a portion including an optical member. The portion based on semiconductor material may be referred to as semiconductor substrate. FIG. 1 illustrates a cross section of one pixel, but actually, the substrates are provided with a large number of pixels, and may further include a column amplification unit, a vertical scan unit, and a horizontal scan unit.

An interface 101a exists between silicon of a first substrate and an interlayer insulating film disposed on the silicon. An interface 101b exists between silicon of a second substrate and an interlayer insulating film disposed on the silicon. A plurality of photoelectric conversion units is disposed on the first substrate, and a plurality of readout circuits to process or read signals generated by each of the photoelectric conversion units is disposed on the second substrate. The readout circuits include a part of pixel circuits and peripheral circuits provided for every pixel array.

The pixel circuits may include a floating diffusion (hereinafter, referred to as FD), a transfer unit configured to transfer signals from the photoelectric conversion units to the FD, a pixel amplification unit electrically connected to the FD at a gate thereof, and a pixel reset unit configured to reset an electric potential inside an input node of the pixel amplification unit. The peripheral circuits may include signal processing units such as column amplification units and column analog to digital (AD) conversion units that are provided for every pixel array. The peripheral circuits may further include vertical scanning circuits and horizontal scanning circuits.

The entire above-described components of the readout circuits may be arranged on the second substrate, or a part of the components may be arranged on the second substrate. It is desirable that, as illustrated in FIG. 1, the transfer unit and the FD can be arranged on the first substrate, and the other components including the pixel amplification unit and the pixel reset unit can be arranged on the second substrate.

The solid-state imaging apparatus includes a photoelectric conversion unit 102, an FD 103, and a contact plug 104 electrically connected to the FD. The contact plug 104 can be formed by filling a contact hole in the interlayer insulating film with a conductive element such as tungsten.

The solid-state imaging apparatus further includes a first conductive pattern 105 disposed on the first substrate. The first conductive pattern 105 is electrically connected to the contact plug 104. The first substrate is provided with a plurality of the first conductive patterns 105. The first conductive patterns 105 are electrically separated from one another.

The solid-state imaging apparatus further includes a second conductive pattern 106 disposed on the second substrate. The second substrate is provided with a plurality of the second conductive patterns 106. The second conductive patterns 106 are electrically separated from one another.

Each of the second conductive patterns 106 is electrically connected to a gate of the pixel amplification unit and a source of the pixel reset unit on the second substrate, via a plug and a wiring for example.

In FIG. 1, a first direction axis 107 indicates a first direction, and a second direction axis 108 indicates a second direction different from the first direction. The first direction can perpendicularly intersect with the second direction.

Each of the first conductive patterns 105 has a first electrical connection portion to be brought in contact with the second conductive patterns 106. Each of the second conductive patterns 106 has a second electrical connection portion to be brought in contact with the first conductive patterns 105.

Figure 2:
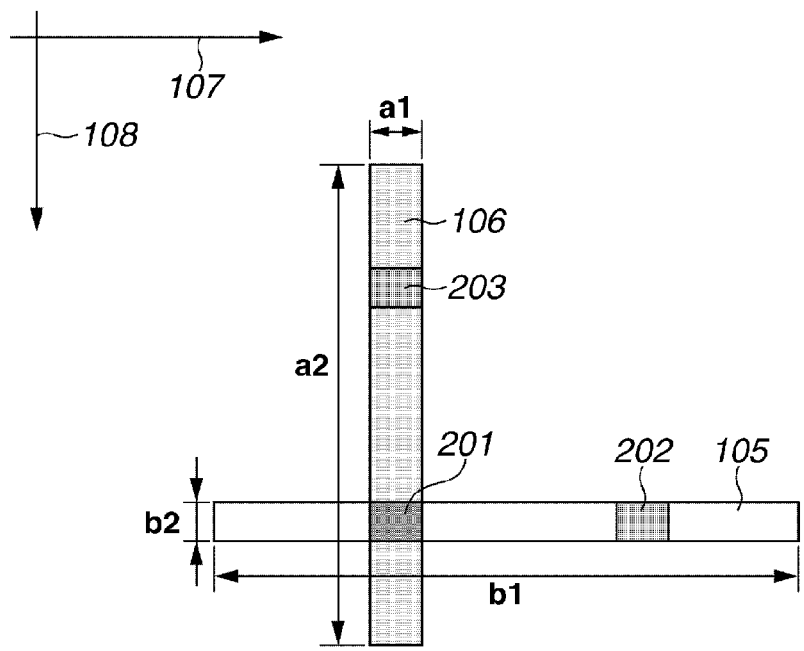
FIG. 2 is a schematic top view illustrating the solid-state imaging apparatus according to the first exemplary embodiment.

FIG. 2 is a schematic top view illustrating the first and second electrical connection portions between the first and second substrates in the solid-state imaging apparatus according to the first exemplary embodiment. The parts having functions similar to those in FIG. 1 are referred to the same reference numerals, and are not described.

The first conductive pattern 105 is connected to the second conductive pattern at an electrical connection portion 201. The electrical connection portion 201 is formed at the contact between a first electrical connection portion of the first conductive pattern 105 and a second electrical connection portion of the second conductive pattern 106.

The first conductive pattern 105 is connected to a conductive element at an electrical connection portion 202. The conductive element electrically connects the first conductive pattern 105 to the FD 103. The second conductive pattern 106 is connected to a conductive element at an electrical connection portion 203. The conductive element electrically connects the second conductive pattern 106 to the gate of the pixel amplification unit and to the source of the pixel reset unit. It is desirable that the electrical connection portions 202 and 203 are located at two-dimensionally different positions from the electrical connection portion 201.

The first conductive pattern 105 extends in the first direction, and the second conductive pattern 106 extends in the second direction. When the first electrical connection portion of the first conductive pattern 105 contacts the second electrical connection portion of the second conductive pattern 106, the first conductive pattern 105 is electrically connected to the second conductive pattern 106.

The first conductive pattern 105 has a length b1 along the first direction, and a length b2 along the second direction. The second conductive pattern 106 has a length a1 along the first direction, and a length a2 along the second direction. The length b1 is longer than the length b2, and the length a2 is longer than the length a1.

It is desirable that the lengths a1 and b1 of the first and second conductive patterns respectively can be shorter than a pixel pitch. Further, it is desirable that, in a configuration where the pixel amplification unit is shared by a plurality of photoelectric conversion units, an upper limit of the length a1 or the length b1 can be shorter than the total pixel pitch of the number of pixels of the photoelectric conversion units which share the pixel amplification unit. The term "pixel pitch" herein is defined as a pixel pitch on the first substrate. More specifically, a pixel pitch can be defined as a length between the centers of adjacent photoelectric conversion units.

Figure 8:
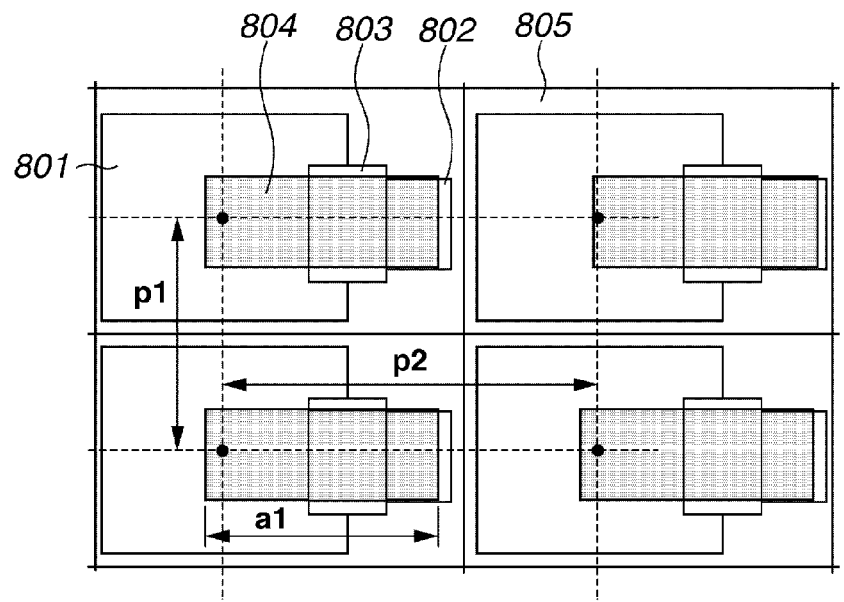
FIG. 8 illustrates the relationship between conductive patterns and pixel pitches of the solid-state imaging apparatus according to the first exemplary embodiment.

FIG. 8 illustrates an example of the positional relationship between a pixel pitch and a conductive pattern on the first substrate. This example illustrates an arrangement with a photoelectric conversion unit, an FD, and a transfer unit on the first substrate.

The first substrate includes a photoelectric conversion unit 801, a FD 802, a transfer gate 803 configuring a part of the transfer unit, a first conductive pattern 804, and an element separation area 805 for determining an active area in a semiconductor area. A pixel pitch p1 extends in the vertical direction, and a pixel pitch p2 extends in the horizontal direction. In this example, the first conductive pattern 804 has a length a1 extending in the horizontal direction. The length a1 is shorter than the pixel pitches p1 and p2. In the case where the pixel pitches are different in adjacent directions as in this example, the length a1 can be set to be shorter than at least a longer pixel pitch of the different pitches.

The first conductive pattern 804 is arranged to overlap with a part of the photo-electric conversion unit 801. In other words, the first conductive pattern 804 is arranged to extend to a part of a region that corresponds to a vertical projection of the photoelectric conversion unit in the direction to the second substrate. This structure advantageously enables light transmitted through the photoelectric conversion unit to be returned to the photoelectric conversion unit by reflection.

Figure 9A:
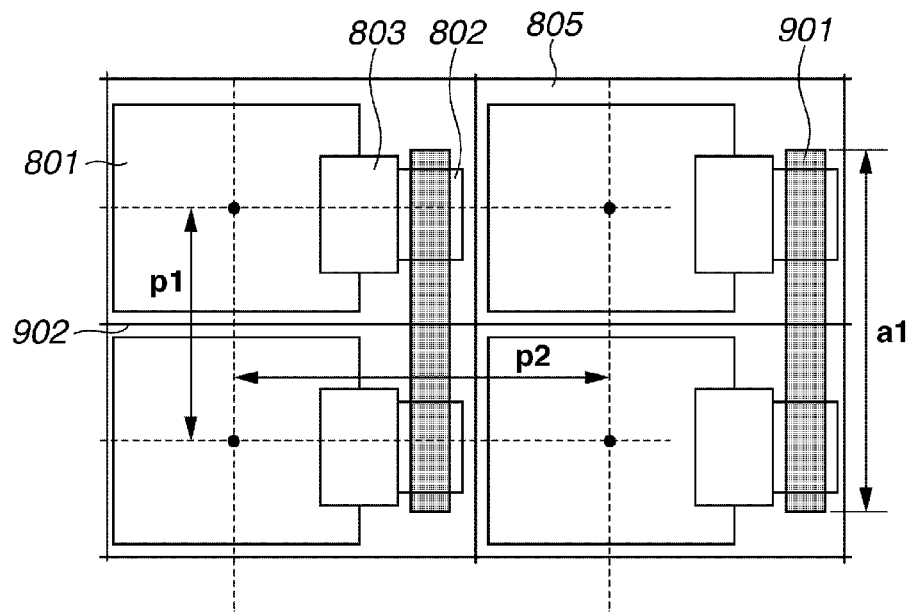
FIG. 9A illustrates the relationship between conductive patterns and pixel pitches of the solid-state imaging apparatus according to the first exemplary embodiment.
Figure 9B:
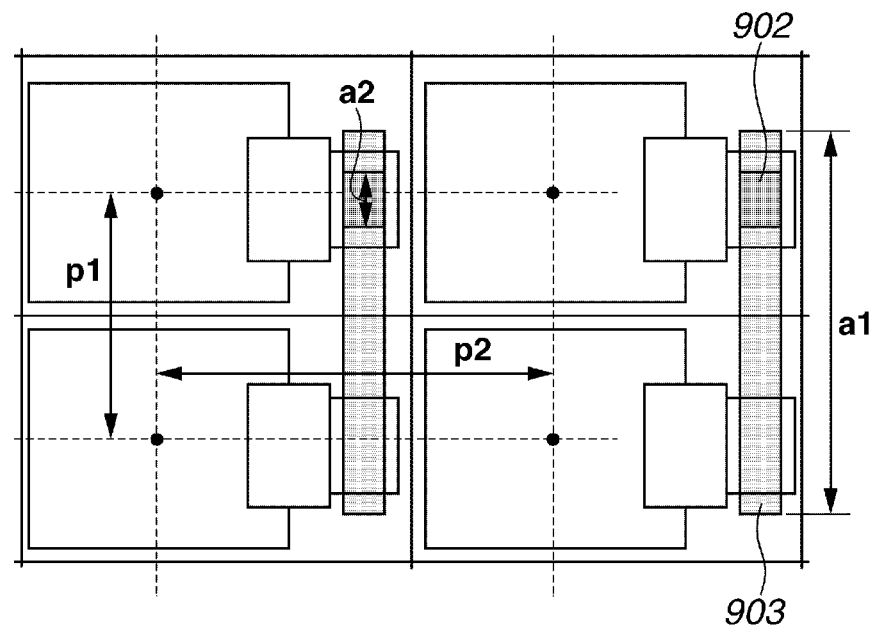
FIG. 9B illustrates the relationship between conductive patterns and pixel pitches of the solid-state imaging apparatus according to the first exemplary embodiment.

FIGS. 9A and 9B are top views each illustrating an example of the first substrate on which a plurality of photoelectric conversion units shares the pixel amplification unit. The parts similar to those in FIG. 8 are referred to the same reference numerals, and detail description thereof are omitted. FIGS. 9A and 9B illustrate structures of first and second examples respectively, both of which are included within the scope of the present exemplary embodiment.

In FIG. 9A, the first substrate includes a first conductive pattern 901. The first conductive pattern 901 has a length a1 extending in the vertical direction, and is formed by a top wiring layer. The first conductive pattern 901 contacts the second conductive pattern on the second substrate to form an electrical connection portion. The first conductive pattern 901 extends across a borderline 902 between pixels. This arrangement can increase the length of the first conductive pattern parallel to the first direction, and ensures electrical connection between the first and second conductive patterns.

It is desirable that the first conductive pattern 901 has a length a1 in the vertical direction, and the length a1 can be longer than the pixel pitch p1 and shorter than twice that of the pixel pitch p1. In a configuration where the pixel amplification unit is shared by a plurality of photoelectric conversion units, the lengths a1 can be less than the total pitch of the number of pixels of the photoelectric conversion units in the array direction which share the pixel amplification unit. For example, when the pixel amplification unit is shared by four photoelectric conversion units, the lengths a1 can be longer than three times that of the pixel pitch and less than four times that of the pixel pitch. This can be generalized into a condition of L is larger than or equal to ((n−1)*p) and is smaller than or equal to (n*p), where L is an extending length of a conductive pattern, n is the number of pixels sharing the pixel amplification unit, and p is the pixel pitch.

In FIG. 9B, a conductive pattern 902 is formed by a top wiring layer. The conductive pattern 902 contacts the second conductive pattern and forms an electrical connection portion. The conductive pattern 902 has a length a2 in the vertical direction that is shorter than the pixel pitch p1. A conductive pattern 903 is formed by a wiring layer lower than the conductive pattern 902. The conductive patterns 902 and 903 are electrically connected to each other via a plug.

In the second example in FIG. 9B, the conductive pattern that actually contacts the second conductive pattern, that is the conductive pattern 902, has an extending length shorter than that in the structure in FIG. 9A. The present invention can be implemented in the structure in FIG. 9B, but the electrical connection can be ensured in the structure in FIG. 9A more reliably than in the structure in FIG. 9B.

FIGS. 8, 9A, and 9B are used to describe the first conductive pattern, but the description can be applied to the second conductive pattern. In this case, the relationship between a pixel pitch and the second conductive pattern on the first substrate can be defined as a condition similar to the above-described one. If a plurality of pixels shares the pixel amplification unit as in the example of the first conductive pattern, the second conductive pattern can be arranged to extend across borderlines between the pixels.

As in the present exemplary embodiment, the first conductive pattern contacts with the second conductive pattern at the intersecting portion thereof to be electrically connected to one another, so that electrical connection between the first and second substrates can be ensured while suppressing increase in capacitance of the FD (FD capacitance).

More specifically, a comparative example is given, in which the first and second conductive patterns each have a square shape of 0.2 micrometer*0.2 micrometer. In other words, a1=a2=b1=b2 is satisfied. In this comparative example, it is assumed that good electrical connection can be provided when a connection portion has an area of 0.01 square micrometers or more, in order to obtain a resistance within a desired range. In the comparative example, misalignment ranging more than 0.1 micrometer reduces the area of the connection portion to less than 0.01 square micrometers, which provides poor electrical connection due to a resistance beyond the desired range.

In contrast, when the first and second substrates have dimensions of a1=b1=0.4 micrometer and a2=b2=0.1 micrometer, and a connection portion having an area of 0.01 square micrometers or more, it is assumed to provide the good electrical connection. In this case, misalignment of within 0.15 micrometer is allowable, and accordingly the allowable range for the misalignment will be 1.5 times that in the comparative example.

In addition, the first and second conductive patterns having a shape of a large aspect ratio such as that of the present exemplary embodiment are advantageous in a manufacturing process. More specifically, such a shape provides a significant advantage when the conductive patterns for electrical connection are manufactured with copper for wiring material using a damascene method (damascene structure). If the first conductive pattern has a square shape of a larger area for good electrical connection as in the comparative example, defects such as dishing are likely to occur in a chemical mechanical polishing (CMP) process for formation of the damascene structure. In contrast, when at least one of the first and second conductive patterns has a shape of a large aspect ratio which extends in a certain direction, the probability of occurrence of dishing in CMP process can be decreased as compared with that in the comparative example.

Figure 3:
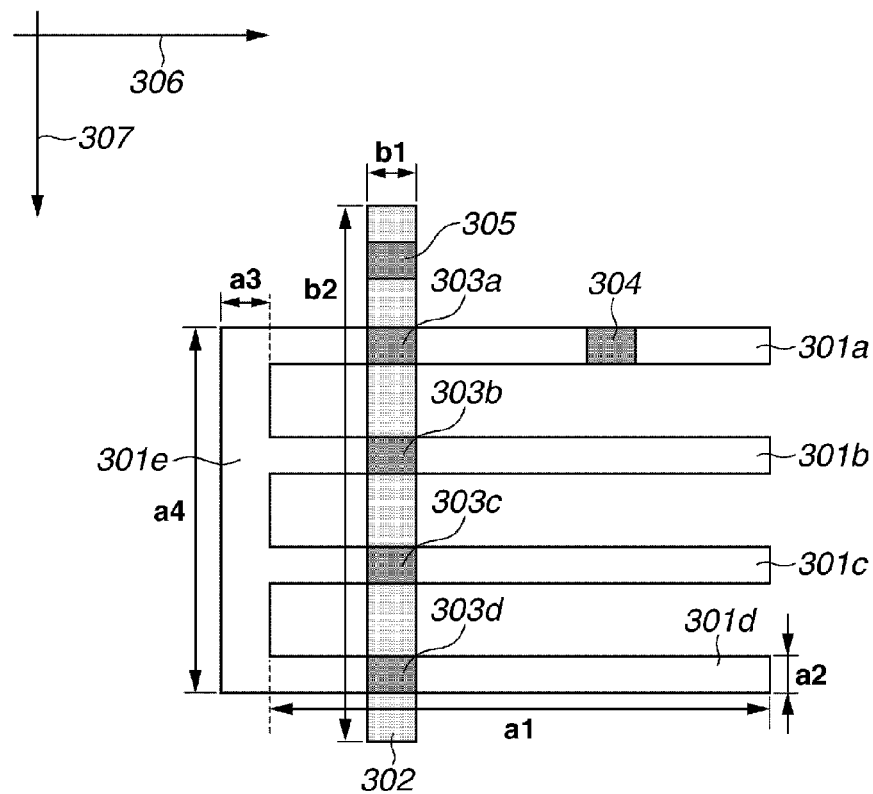
FIG. 3 is a schematic top view illustrating a solid-state imaging apparatus according to a second exemplary embodiment.

FIG. 3 is a top view illustrating an electrical connection portion according to a second exemplary embodiment. The present exemplary embodiment differs from the first exemplary embodiment in that one first conductive pattern is connected to one second conductive pattern at a plurality of electrical connection portions.

The first conductive pattern includes partial patterns 301a to 301e. The first conductive pattern includes a plurality of partial patterns, whereas the conductive pattern according to the first exemplary embodiment can be said to include a single partial pattern. The partial patterns 301a to 301d intersect with a second conductive pattern 302 respectively at electrical connection portions 303a to 303d. The first conductive pattern includes an electrical connection portion 304 to intersect with a conductive element that electrically connects the partial pattern 301a to the FD.

The second conductive pattern 302 includes an electrical connection portion 305 to intersect with a conductive element that electrically connects the second conductive pattern 302 to a gate of the pixel amplification unit and a source of the pixel rest unit. A direction axis 306 indicates a first direction, and a direction axis 307 indicates a second direction.

The partial patterns 301a to 301d each have a length a1 parallel to the first direction and a length a2 parallel to the second direction. The length a1 is longer than the length a2. The partial pattern 301e has a length a3 parallel to the first direction and a length a4 parallel to the second direction. The partial pattern 301e is provided to electrically connect the partial patterns 301a to 301d one another. The partial pattern 301e has no electrical connection portion to be connected to the second conductive pattern 302. In the present exemplary embodiment, the partial patterns 301a to 301d extend more in the first direction than in the second direction. In other words, a single first conductive pattern is provided with a plurality of parts extending more in the first direction than in the second direction.

The second conductive pattern 302 has a length b1 parallel to the first direction and a length b2 parallel to the second direction. The length b2 is longer than the length b1.

In the present exemplary embodiment, the first conductive pattern includes the plurality of partial patterns extending in the first direction, thus a plurality of electrical connection portions is provided between the first conductive pattern and the second conductive pattern. As compared with the first exemplary embodiment, the structure according to the present exemplary embodiment can provide more secured electrical connection between the patterns. The actual number of the electrical connection portions is not limited to that in the above example, and any plural number of electrical connection portions provides the same effect as that of the present exemplary embodiment. In FIG. 3, the partial patterns 301a to 301e are formed on the same wiring layer, but for example, the partial pattern 301e may be formed on a wiring layer different from those of the partial patterns 301a to 301d and electrically connected to the partial patterns 301a to 301d through a via plug. In this case, the first conductive pattern is formed by a plurality of wiring layers.

Figure 4:
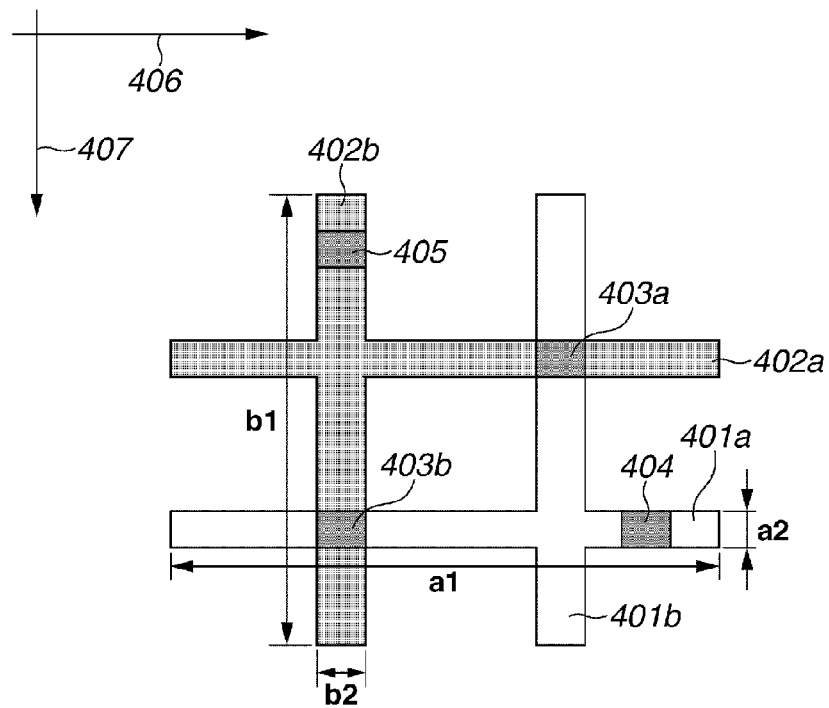
FIG. 4 is a schematic top view illustrating a modified solid-state imaging apparatus.

FIG. 4 is a top view illustrating electrical connection portions of a modification of the second exemplary embodiment. The modification differs from the second exemplary embodiment in that the first and second conductive patterns each have partial patterns extending both in the first and second directions.

The first conductive pattern includes partial patterns 401a and 401b. The partial pattern 401a has a length a1 parallel to the first direction and a length a2 parallel to the second direction. The length a1 is longer than the length a2. Accordingly, the partial pattern 401a extends more in the first direction than in the second direction.

The second conductive pattern includes partial patterns 402a and 402b. The partial pattern 402b has a length b2 parallel to the first direction and a length b1 parallel to the second direction. The length b1 is longer than the length b2. Accordingly, the partial pattern 402b extends more in the second direction different from the first direction. The partial pattern 401b has a shape similar to that of the partial pattern 402b, and the partial pattern 402a has a shape similar to that of the partial pattern 401a.

Accordingly, the first conductive pattern includes the partial pattern (conductive pattern 401a) extending more in the first direction and the partial pattern (conductive pattern 401b) extending more in the second direction. The second conductive pattern includes the partial pattern (conductive pattern 402a) extending more in the first direction and the partial pattern (conductive pattern 402b) extending more in the second direction.

The first conductive pattern is electrically connected to the second conductive pattern at electrical connection portions 403a and 403b. More specifically, the electrical connection portion 403a is intersection between the partial pattern 401b extending more in the second direction and the partial pattern 402a extending more in the first direction. Further, the electrical connection portion 403b is intersection between the partial pattern 401a extending more in the first direction and the partial pattern 402b extending more in the second direction.

The partial pattern 401a includes an electrical connection portion 404 to intersect with a conductive element that electrically connects the partial pattern 401a with the FD. The partial pattern 402b has an electrical connection portion 405 to intersect with a conductive element that electrically connects the partial pattern 402b to a gate of the pixel amplification unit and a source of the pixel rest unit.

The present exemplary embodiment can also provide the effect similar to that in the second exemplary embodiment.

Figure 5:
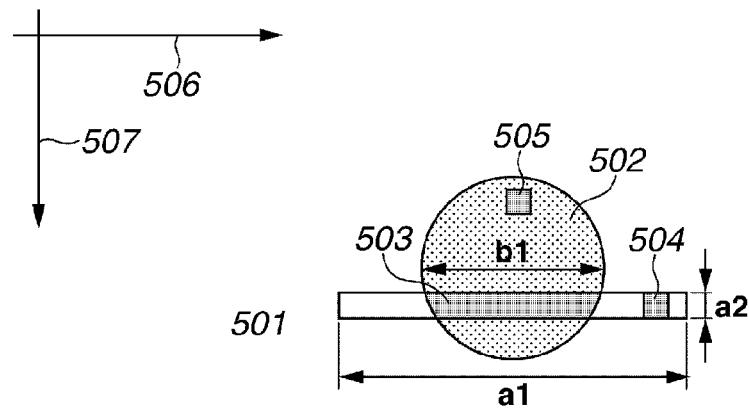
FIG. 5 is a schematic top view illustrating a solid-state imaging apparatus according to a third exemplary embodiment.

FIG. 5 is a top view illustrating an electrical connection according to a third exemplary embodiment. The present exemplary embodiment differs from the first and second exemplary embodiments in the shape of a second conductive pattern. More specifically, the second conductive pattern of the present exemplary embodiment has a circular shape.

In FIG. 5, a first conductive pattern 501 contacts a second conductive pattern 502 at an electrical connection portion 503. The first conductive pattern 501 includes an electrical connection portion 504 to intersect with a conductive element that electrically connects the first conductive pattern 501 with an FD. The second conductive pattern 502 includes an electrical connection portion 505 to intersect with a conductive element that electrically connects the second conductive pattern 502 with a gate of a pixel amplification unit and a source of a pixel reset unit. In FIG. 5, a direction axis 506 indicates a first direction, and a direction axis 507 indicates a second direction.

The first conductive pattern 501 has a length a1 parallel to the first direction and a length a2 parallel to the second direction. The length a1 is longer than the length a2. Accordingly, the first conductive pattern 501 extends more in the first direction than in the second direction.

The second conductive pattern 502 has a circular shape having a diameter b1.

According to the present exemplary embodiment, the second conductive pattern 502 has a larger area than those in the above exemplary embodiments, the FD capacitance may be increased, but electrical connection between the patterns can be further ensured. In the present exemplary embodiment, the first conductive pattern 501 can be manufactured using the damascene method, whereas the second conductive pattern 502 can be manufactured using a wiring patterning other than the damascene method. Such manufacturing process can prevent defects such as dishing in CMP process for formation of the damascene structure, even if the area of the second conductive pattern 502 increases.

As described above, the structures of the electrical connection portions according to the exemplary embodiments of the present invention each enhance the reliability of electrical connection between the first and second substrates.

A pixel in a solid-state imaging apparatus to which the electrical connection structures according to the first to third exemplary embodiments are applicable can be illustrated as an equivalent circuit.

Figure 6A:
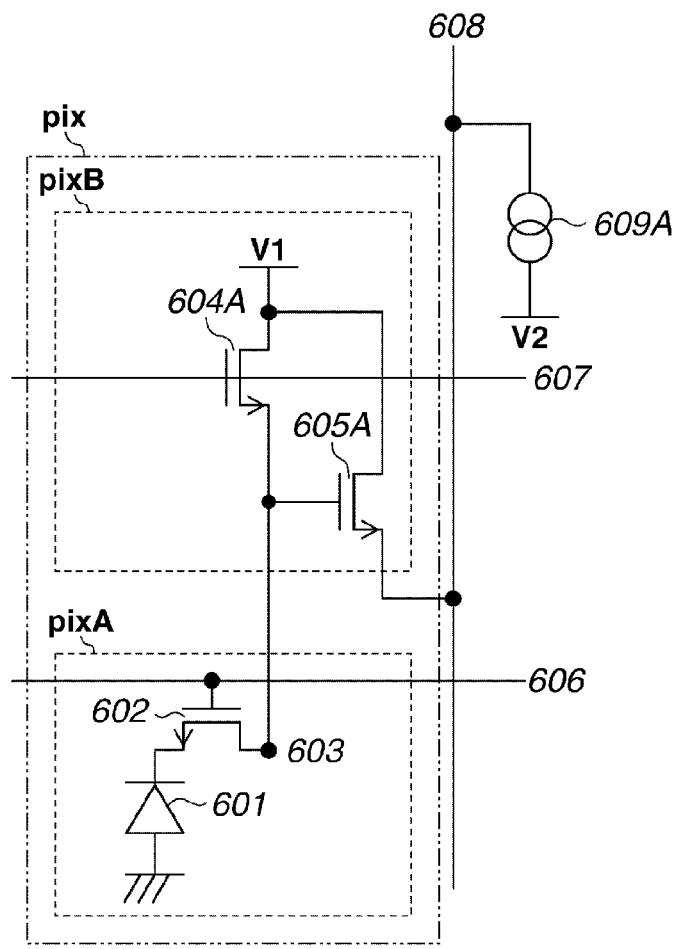
FIG. 6A illustrates an example of a pixel equivalent circuit applicable to the present invention.
Figure 6B:
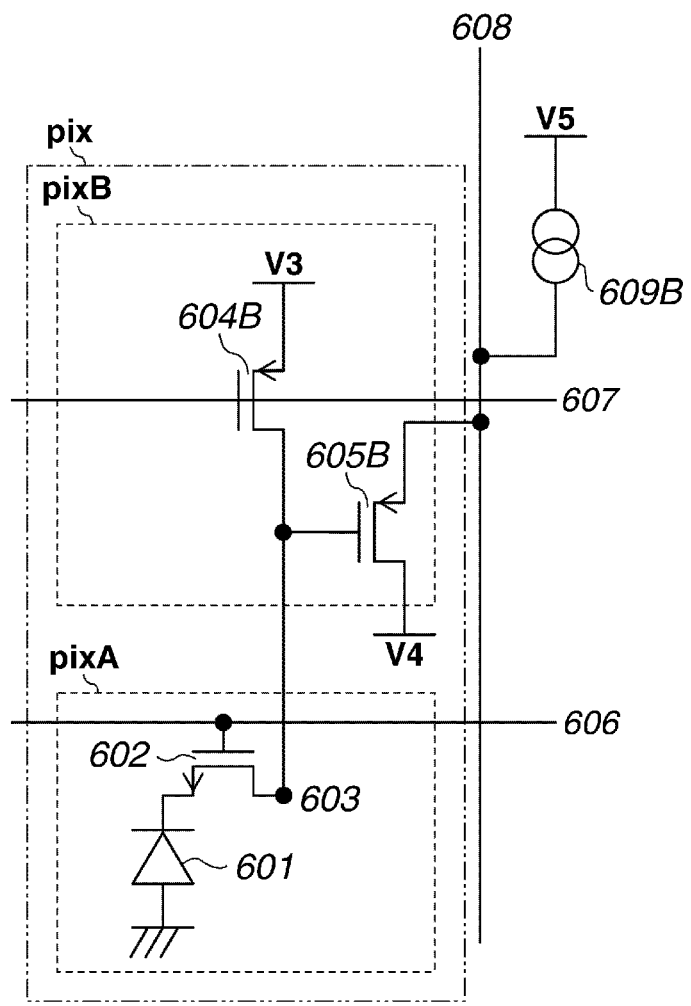
FIG. 6B illustrates an example of a pixel equivalent circuit applicable to the present invention.

FIGS. 6A and 6B each illustrate an equivalent circuit of a pixel according to the present invention. FIGS. 6A and 6B each illustrate only one pixel, but the actual solid-state imaging apparatus includes pixel arrays including a plurality of pixels.

A photoelectric conversion unit 601 generates electron holes and electrons by photo-electric conversion, and may include a photodiode.

A transfer unit 602 transfers an electrical charge of the photoelectric conversion unit, and may include a metal oxide semiconductor (MOS) transistor (transfer MOS transistor).

An FD 603 receives the electrical charge of the photoelectric conversion unit transferred from the transfer unit when the electric potential is in a floating state.

A pixel reset unit 604 sets at least the electric potential of the FD to a reference electric potential. Alternatively, the pixel reset unit 604 sets the electric potential of the photoelectric conversion unit to the reference electric potential by turning on the photoelectric conversion unit and the transfer unit simultaneously. A MOS transistor (reset MOS transistor) may be used as the pixel reset unit 604.

A pixel amplification unit 605 amplifies a signal based on one of a charge pair generated in the photoelectric conversion unit, and outputs the signal. In the case where a MOS transistor is used as the pixel amplification unit 605, a gate of the MOS transistor (amplification MOS transistor) is electrically connected to the FD.

A transfer control line 606 controls operations of the transfer unit. A reset control line 607 controls operations of the pixel reset unit. In the case where the transfer unit and the reset unit are each the MOS transistor, these control lines transfer pulses to gates of the MOS transistors to turn on and off the transistors. These control lines are supplied with drive pulses from a vertical scanning circuit (not illustrated).

A vertical output line 608 receives amplified signals serially output from the plurality of pixel amplification units 605 in pixel arrays.

A power source 609 supplies a bias current to the amplification units 605. In the present circuit configuration, the power source 609 supplies a bias current for a source follower operation of the amplification MOS transistor.

The amplification MOS transistor and the reset MOS transistor are supplied with a voltage V1 in FIG. 6A at the drains thereof. Here, the transistors are supplied with a common voltage in FIG. 6A, but may be supplied with separate voltages. In FIG. 6A, a power source 609A is supplied with a voltage V2.

The reset MOS transistor is supplied with a voltage V3 in FIG. 6B at the drain thereof. The amplification MOS transistor is supplied with a voltage V4 in FIG. 6B at the drain thereof. In FIG. 6B, a power source 609B is supplied with a voltage V5.

As elements constituting the pixels, in FIGS. 6A and 6B, each pixel includes a portion pixA arranged on a first semiconductor substrate, and a portion pixB arranged on a second semiconductor substrate. The portions pixA and pixB constitute a pixel pix.

The difference between FIG. 6A and FIG. 6B is described. The reference numerals for different members are accompanied with different alphabets A and B. More specifically, the amplification MOS transistor and the reset MOS transistor have different conductivity types. In FIG. 6A, negative channel metal oxide semiconductor (NMOS) transistors are used, and in FIG. 6B, positive channel metal oxide semi-conductor (PMOS) transistors are used. Corresponding to the type difference, different voltages are supplied to the transistors and power sources.

In FIG. 6A, a power source voltage V1 is 5 V or 3.3 V for example. The voltage V2 is lower than the voltage V1, and may be the grounding potential. In contrast, in FIG. 6B, the voltages V3 and V4 are relatively low electric potential such as the grounding potential, and the voltage V5 is a relatively high voltage of 3.3 V or 1.8 V for example as compared with the voltage V3.

In FIG. 6B, the amplification MOS transistor is a PMOS transistor. The photoelectric conversion unit is configured to use electrons as signal charges. With a larger amount of incident light, the electric potential at the gate of the PMOS transistor is decreased. In response to the decrease in the potential at the gate, the electric potential at the source of the PMOS transistor is increased as compared with that with a smaller amount of incident light. In other words, a common output line can be driven with a high driving force when signal amplitude is larger as compared with that at the reset timing.

Accordingly, the structure in FIG. 6B is more advantageous than that in FIG. 6A in terms of reading speed. Conventionally, such structures were arranged on one semi-conductor substrate, and required division of a pixel layout into wells, which complicated the structures. The structure using separate substrates as in the present invention can suppress such disadvantages. In addition, the structure in FIG. 6B can narrow a range of operation voltage more than that in FIG. 6A, which provides another advantage in terms of lower power source voltage.

This advantage is essentially provided not by the PMOS transistor serving as the amplification MOS transistor, but by the reverse polarity of the MOS transistor relative to the signal charge. More specifically, PMOS transistors are used for the amplification MOS transistor and the reset MOS transistor when the signal charges are electrons, and NMOS transistors are used when the signal charges are holes. As for the conductivity type of the transfer transistor, the transfer MOS transistor is of a first conductivity type, and the amplification MOS transistor and the reset transistor are of a second conductivity type that is an opposite to the first conductivity type.

The structures of pixels have been described above, however the pixels may have other structure. For example, the amplifying transistor may be a junction field-effect transistor (JFET). The photoelectric conversion unit may use holes as signal charges. In this case, the transfer transistor is a PMOS transistor. In addition, a plurality of photoelectric conversion units may share the amplifying transistor and the reset transistor.

Alternatively, a selection transistor may be arranged in series with the amplifying transistor. Assignment of pixels to a plurality of semiconductor substrates is not limited to the above-described examples. For example, the reset MOS transistor and the amplification MOS transistor may be arranged on a first semiconductor substrate. Alternatively, no amplification MOS transistor and reset MOS transistor are arranged in pixels, and electrical charges of the photoelectric conversion units may be directly output to a common output line by a transfer MOS transistor.

The first to third exemplary embodiments have been described with examples of structures applied to connection portions between the FD on the first substrate and the gate of the amplifying transistor and the source of the reset transistor on the second substrate. The structures, however, can be applied to the cases with a large number of electrical connection portions provided between first and second substrates for every pixel or every pixel array.

Figure 7:
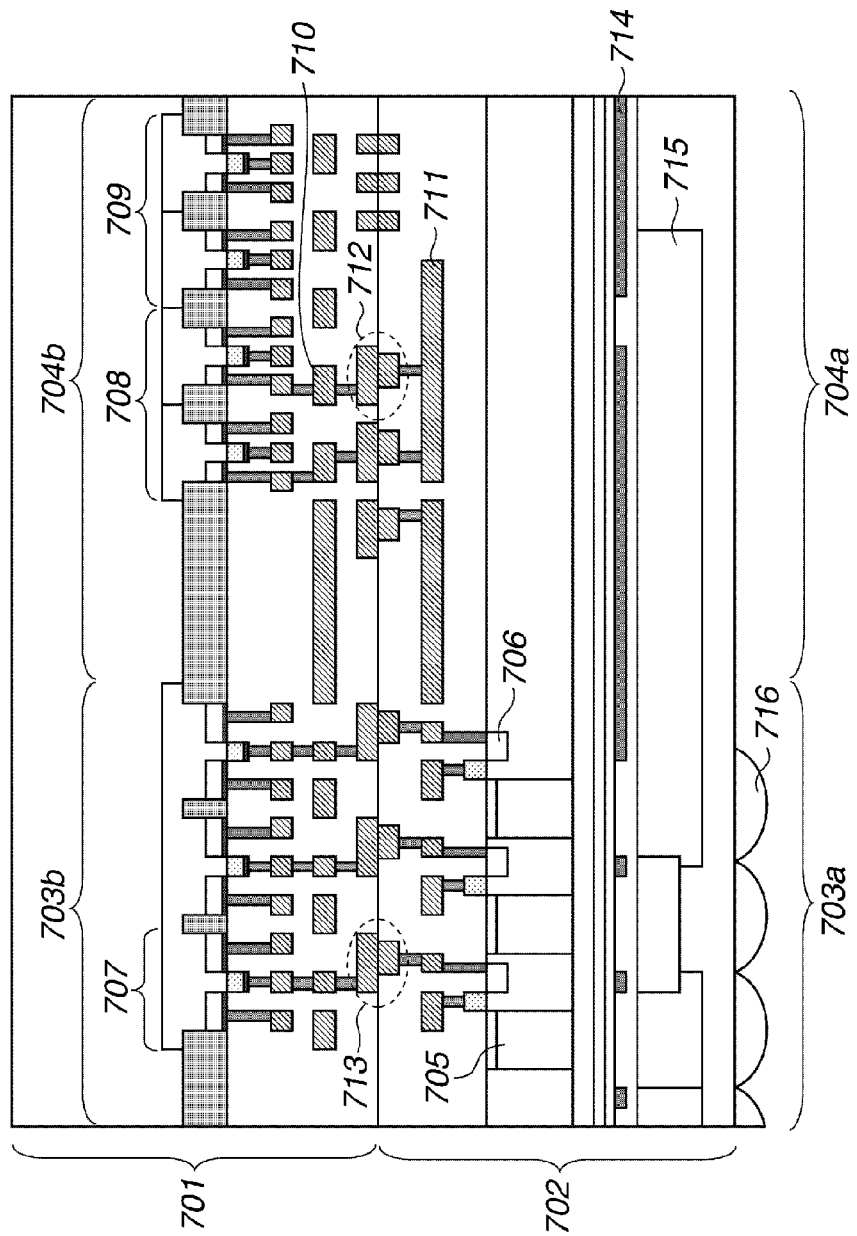
FIG. 7 is a cross sectional view illustrating an example of a solid-state imaging apparatus applicable to the present invention.

FIG. 7 is a cross sectional view illustrating electrical connection portions between first and second substrates. In this case, the first substrate includes photoelectric conversion units, FDs, and transfer units, and the second substrate includes pixel amplification units and pixel reset units. The electrical connection portions are provided between the FDs and gates of the pixel amplification units and sources of the pixel reset units. The electrical connection portions, however, may be provided in other ways.

A first substrate 701 includes a pixel area 703a. A second substrate 702 includes a pixel area 703b. A first peripheral area 704a is arranged on the first substrate 701. Further, the first peripheral area 704a is arranged outside of the pixel area 703a. A second peripheral area 704b is arranged on the second substrate 702. Further, the second peripheral area 704b is arranged outside of the pixel area 703b, and is provided with a circuit to process signals output from the pixel areas via a common output line or to control signal outputs from the pixel areas.

The first and second substrates are provided with photoelectric conversion units 705, FDs 706, and amplifying transistors 707 constituting the pixel amplification unit. The amplifying transistors 707 are, at their gates, electrically connected to the FDs respectively. A MOS transistor 708 constitutes a part of a readout circuit that is arranged in the second peripheral area. Examples of the readout circuit include a parallel-processing circuit configured to process signals read for every pixel array in parallel. Examples of the parallel-processing circuit include a column amplifier and a column AD. MOS transistor 709 is a circuit arranged in the second peripheral circuits to provide circuits other than the parallel-processing circuit.

A third conductive pattern 710 constitutes a direct voltage supply wiring that supplies a direct voltage to the MOS transistor 709 constituting the parallel-processing circuit. The third conductive pattern 710 extends in the direction perpendicular to the plane of the FIG. 7, and supplies a common direct voltage to the MOS transistor 709 in every parallel processing circuit. The third conductive pattern is arranged outside of the pixel area.

Fourth conductive pattern 711 is provided outside of the pixel area on the first substrate.

An electrical connection portion 712 electrically connects the third conductive pattern 710 to the fourth conductive pattern 711. For example, the electrical connection portion 712 electrically connects a conductive pattern formed on a top wiring layer on the first substrate to another conductive pattern formed on of a top wiring layer on the second substrate. The structures described in the first to third exemplary embodiments can be applied to the electrical connection portion 712.

The fourth conductive pattern 711 is arranged in the first peripheral area on the first substrate. The first peripheral area is provided with a smaller number of or no circuit elements as compared to those in the second peripheral area on the second substrate. The arrangement relatively increases the flexibility of layout in the first peripheral area. Hence, the fourth conductive pattern 711 is set to have a larger area than those of the second conductive pattern, so that a resistance value can be decreased while the flexibility of layout in the second peripheral area can be maintained.

An electrical connection portion 713, i.e. second electrical connection portion, electrically connects the FD 706 to the gate of the amplifying transistor 707. The second electrical connection portion can be formed by electrically connecting a conductive pattern formed on a top wiring layer on the first substrate to a conductive pattern formed on a top wiring layer on the second substrate. The second electrical connection portion corresponds to the electrical connection portions described in the first to third exemplary embodiments.

Regarding a relationship between the area of the conductive pattern for the electrical connection portion 712 and the area of the conductive pattern for the electrical connection portion 713, the area of the conductive pattern for the electrical connection portion 713 may be set smaller. Since the electrical connection portion 713 connects the FD 706 to the gate of the amplifying transistor 707, if the conductive pattern has a larger area, the FD will have a larger parasitic capacitance.

The first substrate is further provided with control wiring (not illustrated) to control the transfer unit. The second substrate is provided with a vertical scan unit (not illustrated) configured to supply drive pulses to the control wiring to control conduction of the transfer unit. Accordingly, the control wiring is electrically connected to the vertical scan unit by a structure similar to the electrical connection portion 713.

The present invention has been described using exemplary embodiments, however, any combination and modification of the exemplary embodiments can be made without departing from the scope of the present invention.

For example, in the structures of the first and second exemplary embodiments, the shapes of the first and second conductive patterns can be replaced with each other. Further, in the first and second exemplary embodiments, at least one of the first and second conductive patterns has a partial pattern extending in a predetermined direction and having a length parallel to the predetermined direction longer than a length in a direction other than the predetermined direction. The other conductive pattern may have any shape. The magnitude relationship described in the first exemplary embodiment between the length in the direction that the conductive pattern extends and a pixel pitch is applicable to the other exemplary embodiments.

In the above exemplary embodiments, the present invention is applied to electrical connection portions between the FD and the pixel amplification unit and pixel reset unit. The present invention, however, can be applied to only the elements other than FDs, pixel amplification units, and pixel reset units. More specifically, in the case where transfer units are arranged on the first substrate, and vertical scan units for scanning the transfer units are arranged on the second substrate, the present invention can be applied to electrical connection portions between the vertical scan units and the transfer units. Further, if vertical output lines are also arranged on the first substrate and column amplification units or column readout circuits such as column ADs are arranged on the second substrate, the present invention can be applied to electrical connection portions between the vertical output lines and the column readout circuits.

Alternatively, the first or second conductive pattern may be arranged to extend to a part of a region that corresponds to a vertical projection of the photoelectric conversion units in the direction to the second substrate. Such structure enables light transmitted through the photoelectric conversion unit to return to the photoelectric conversion units, so that light sensitivity can be improved.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures, and functions.

This application claims priority from Japanese Patent Application No. 2010-149478 filed Jun. 30, 2010, which is hereby incorporated by reference herein in its entirety.

REFERENCE SIGNS LIST 102 photoelectric conversion unit
702 first substrate
701 second substrate
105 first conductive pattern
106 second conductive pattern
201 electrical connection portion

The invention claimed is:

1. A solid-state imaging apparatus including a first substrate on which a plurality of photoelectric conversion units are arranged and a second substrate on which a plurality of readout circuits to process or read a signal generated by each of the photoelectric conversion units are arranged, the solid-state imaging apparatus comprising:
   a plurality of first conductive patterns which are arranged on the first substrate and electrically separated from one another; and
      a plurality of second conductive patterns which are arranged on the second substrate and electrically separated from one another,
      wherein each of the plurality of first conductive patterns has a first electrical connection portion to be in contact with at least one of the second conductive pattern, and each of the plurality of second conductive patterns has a second electrical connection portion to be in contact with at least one of the first conductive patterns,
      wherein the first conductive pattern includes a first partial pattern that includes the first electrical connection portion and extends in a first direction, and the second conductive pattern includes a second partial pattern that includes the second electrical connection portion and extends in a second direction different from the first direction, and
      wherein the first partial pattern has a length extending in the first direction longer than a length thereof in the second direction.

2. The solid-state imaging apparatus according to claim 1, wherein the first direction perpendicularly intersects the second direction.

3. The solid-state imaging apparatus according to claim 1, further comprising:
   a plurality of pixels, each pixel including
   the photoelectric conversion unit,
   a floating diffusion,
   a transfer unit configured to transfer a signal from the photoelectric conversion unit to the floating diffusion,
   a pixel amplification unit electrically connected to the floating diffusion at a gate thereof, and
   a pixel reset unit configured to reset an electric potential at an input node of the pixel amplification unit,
      wherein a plurality of the photoelectric conversion units, a plurality of the floating diffusions, and a plurality of the transfer units are arranged on the first substrate, and
   a plurality of the pixel amplification units and a plurality of the pixel reset units are arranged on the second substrate, and
      wherein the plurality of first conductive patterns is electrically connected to the plurality of floating diffusions respectively, and
   the plurality of second conductive patterns is electrically connected to the plurality of gates of the pixel amplification units respectively.

4. The solid-state imaging apparatus according to claim 3, wherein at least part of the plurality of first conductive patterns and the plurality of second conductive patterns is arranged to extend to a part of a region in which the photoelectric conversion unit is vertically projected in a direction to the second substrate.

5. The solid-state imaging apparatus according to claim 3,
   wherein the plurality of the floating diffusions, the plurality of the transfer units configured to transfer a signal from each of the photoelectric conversion units to the floating diffusions, and a plurality of transfer control lines configured to control conduction of the transfer units are arranged on the first substrate, and
   a vertical scan unit configured to supply drive pulses to the plurality of transfer control lines is arranged on the second substrate,
   wherein the plurality of first conductive patterns is electrically connected to the plurality of transfer control line respectively, and
   wherein each of the plurality of second conductive patterns is electrically connected to the vertical scan unit.

6. The solid-state imaging apparatus according to claim 1, wherein the first conductive patterns each have a plurality of the first electrical connection portions, and
   wherein the second conductive pattern each have a plurality of the second electrical connection portions.

7. The solid-state imaging apparatus according to claim 1, wherein at least the plurality of first conductive patterns or the plurality of second conductive patterns are formed by a plurality of wiring layers.

8. The solid-state imaging apparatus according to claim 1,
   wherein each of the first conductive patterns further includes a third partial pattern extending in the second direction,
   wherein each of the second conductive patterns further includes a fourth partial pattern extending in the first direction,
   wherein the third partial pattern includes a third electrical connection portion to be in contact with the fourth partial pattern, and
   wherein the fourth partial pattern further includes a fourth electrical connection portion to be in contact with the third partial pattern.

9. The solid-state imaging apparatus according to claim 1, wherein at least the plurality of first conductive patterns or the plurality of second conductive patterns has a damascene structure.

10. The solid-state imaging apparatus according to claim 1, further comprising:
   a plurality of pixels, each pixel including
   the photoelectric conversion unit,
   a floating diffusion, and
   a transfer unit configured to transfer a signal from the photoelectric conversion unit to the floating diffusion,
      wherein a plurality of sets of the photoelectric conversion unit, the floating diffusion, and the transfer unit are arranged on the first substrate at a predetermined pixel pitch, and
      wherein the first partial pattern has a length parallel to the first direction shorter than the pixel pitch.

11. The solid-state imaging apparatus according to claim 1, further comprising:
a plurality of pixels, each pixel including
the photoelectric conversion unit,
a floating diffusion,
a transfer unit configured to transfer a signal from the photoelectric conversion unit to the floating diffusion,
a pixel amplification unit electrically connected to the floating diffusion at a gate thereof, and
a pixel reset unit configured to reset an electric potential at an input node of the pixel amplification unit,
wherein the plurality of photoelectric conversion units, the plurality of floating diffusions, and the plurality of transfer units are arranged on the first substrate, wherein the plurality of pixel amplification units and the plurality of pixel reset units are arranged on the second substrate,
wherein the pixel amplification unit and the pixel reset unit are shared by the plurality of the photoelectric conversion units,
wherein the plurality of photoelectric conversion units is arranged at a predetermined pixel pitch, and
wherein a condition of L is larger than or equal to $((n-1)*p)$ and is smaller than or equal to $(n*p)$ is satisfied where L is a length of the first partial pattern in the first direction, n is the number of the photoelectric conversion units to be shared, and p is the pixel pitch.

12. A solid-state imaging apparatus including a first substrate on which a plurality of photoelectric conversion units are arranged and a second substrate on which a plurality of readout circuits to process or read a signal generated by each of the photoelectric conversion units are arranged, the solid-state imaging apparatus comprising:
a plurality of first conductive patterns which are arranged on the first substrate and electrically separated from one another; and
a plurality of second conductive patterns which are arranged on the second substrate and electrically separated from one another,
wherein each of the plurality of first conductive patterns has a first electrical connection portion to be in contact with at least one of the second conductive patterns, and
wherein each of the plurality of first conductive patterns has a first electrical connection portion to be in contact with at least one of the second conductive patterns, and
wherein the first conductive pattern includes a first partial pattern that includes the first electrical connection portion and extends in a first direction, and the second conductive pattern includes a second partial pattern that includes the second electrical connection portion and extends in a second direction different from the first direction, and
wherein the second partial pattern has a length extending in the second direction longer than a length thereof in the first direction.

13. The solid-state imaging apparatus according to claim 12, further comprising:
a plurality of pixels, each pixel including
the photoelectric conversion unit,
a floating diffusion, and
a transfer unit configured to transfer a signal from the photoelectric conversion unit to the floating diffusion,
wherein a plurality of sets of the photoelectric conversion unit, the floating diffusion, and the transfer unit are arranged on the first substrate at a predetermined pixel pitch, and
wherein the second partial pattern has a length parallel to the second direction shorter than the pixel pitch.

14. The solid-state imaging apparatus according to claim 12, wherein the first direction perpendicularly intersects the second direction.

15. The solid-state imaging apparatus according to claim 12, further comprising:
a plurality of pixels, each pixel including
the photoelectric conversion unit,
a floating diffusion,
a transfer unit configured to transfer a signal from the photoelectric conversion unit to the floating diffusion,
a pixel amplification unit electrically connected to the floating diffusion at a gate thereof, and
a pixel reset unit configured to reset an electric potential at an input node of the pixel amplification unit,
wherein a plurality of the photoelectric conversion units, a plurality of the floating diffusions, and a plurality of the transfer units are arranged on the first substrate, and
a plurality of the pixel amplification units and a plurality of the pixel reset units are arranged on the second substrate, and
wherein the plurality of first conductive patterns is electrically connected to the plurality of floating diffusions respectively, and
the plurality of second conductive patterns is electrically connected to the plurality of gates of the pixel amplification units respectively.

16. The solid-state imaging apparatus according to claim 15, wherein at least part of the plurality of first conductive patterns and the plurality of second conductive patterns is arranged to extend to a part of a region in which the photoelectric conversion unit is vertically projected in a direction to the second substrate.

17. The solid-state imaging apparatus according to claim 15, wherein the plurality of the floating diffusions, the plurality of the transfer units configured to transfer a signal from each of the photoelectric conversion units to the floating diffusions, and a plurality of transfer control lines configured to control conduction of the transfer units are arranged on the first substrate, and
a vertical scan unit configured to supply drive pulses to the plurality of transfer control lines is arranged on the second substrate,
wherein the plurality of first conductive patterns is electrically connected to the plurality of transfer control line respectively, and
wherein each of the plurality of second conductive patterns is electrically connected to the vertical scan unit.

18. The solid-state imaging apparatus according to claim 12, wherein the first conductive patterns each have a plurality of the first electrical connection portions, and wherein the second conductive pattern each have a plurality of the second electrical connection portions.

19. The solid-state imaging apparatus according to claim 12, wherein at least the plurality of first conductive patterns or the plurality of second conductive patterns are formed by a plurality of wiring layers.

20. The solid-state imaging apparatus according to claim 12,
wherein each of the first conductive patterns further includes a third partial pattern extending in the second direction,
wherein each of the second conductive patterns further includes a fourth partial pattern extending in the first direction,
wherein the third partial pattern includes a third electrical connection portion to be in contact with the fourth partial pattern, and wherein the fourth partial pattern further includes a fourth electrical connection portion to be in contact with the third partial pattern.

21. The solid-state imaging apparatus according to claim 12, wherein at least the plurality of first conductive patterns or the plurality of second conductive patterns has a damascene structure.

* * * * *